(12) United States Patent
Kohmura et al.

(10) Patent No.: US 8,357,015 B2
(45) Date of Patent: Jan. 22, 2013

(54) METAL-RESIN COMPOUND MEMBER

(75) Inventors: Yoshihiko Kohmura, Aichi (JP); Shingo Yoshida, Aichi (JP); Yusuke Fuji, Aichi (JP); Takaya Hirai, Aichi (JP); Wataru Kawagishi, Aichi (JP)

(73) Assignee: NGK Spark Plug Co., Ltd. (JP)

( * ) Notice: Subject to any disclaimer, the term of this patent is extended or adjusted under 35 U.S.C. 154(b) by 189 days.

(21) Appl. No.: 12/734,731

(22) PCT Filed: Nov. 21, 2008

(86) PCT No.: PCT/JP2008/071204
§ 371 (c)(1),
(2), (4) Date: May 19, 2010

(87) PCT Pub. No.: WO2009/069542
PCT Pub. Date: Jun. 4, 2009

(65) Prior Publication Data
US 2010/0255732 A1    Oct. 7, 2010

(30) Foreign Application Priority Data
Nov. 29, 2007   (JP) .................................. 2007-309364

(51) Int. Cl.
*H05K 7/14* (2006.01)
(52) U.S. Cl. ........................................ 439/736; 361/752
(58) Field of Classification Search .................. 439/736, 439/76.1; 361/736, 752; 264/272.11; 29/883
See application file for complete search history.

(56) References Cited

U.S. PATENT DOCUMENTS

| | | | | |
|---|---|---|---|---|
| 4,723,196 A | * | 2/1988 | Hofmeister et al. .......... | 361/759 |
| 4,894,015 A | * | 1/1990 | Stockero et al. ................ | 439/67 |
| 5,060,113 A | * | 10/1991 | Jacobs ........................... | 361/721 |
| 5,272,594 A | * | 12/1993 | Delamoreaux ............... | 361/736 |
| 5,433,628 A | * | 7/1995 | Sadaishi et al. ............... | 439/736 |
| 5,569,050 A | * | 10/1996 | Lloyd ........................... | 439/465 |
| 5,673,181 A | * | 9/1997 | Hsu ............................... | 361/760 |
| 5,761,805 A | * | 6/1998 | Guyer ........................... | 29/883 |
| 5,978,226 A | * | 11/1999 | Thomas et al. ............... | 361/707 |
| 6,034,876 A | * | 3/2000 | Ohno et al. ................... | 361/752 |
| 6,180,045 B1 | * | 1/2001 | Brandenburg et al. ....... | 264/263 |

(Continued)

FOREIGN PATENT DOCUMENTS

DE    88 16 054    9/1989

(Continued)

OTHER PUBLICATIONS

Form PCT/ISA/210—Int'l Search Report (from corresponding Int'l Patent App. No. PCT/JP2008/071204); 2 pages.

(Continued)

*Primary Examiner* — Neil Abrams
(74) *Attorney, Agent, or Firm* — Kusner & Jaffe

(57) ABSTRACT

A case comprised of a metal-resin composite body having a connector including a terminal fitting, the connector being integrated with an opening of a wall of a case main body so that the connector sandwiches an edge of the wall. The connector is comprised of a base resin formed by injection molding so as to sandwich the wall. A separately-manufactured connector is welded to the base resin. Forming the base resin on the case main body provides a less complicated configuration of the case compared to a case where a connector is formed directly to the case main body.

11 Claims, 9 Drawing Sheets

U.S. PATENT DOCUMENTS

| | | | | |
|---|---|---|---|---|
| 6,362,971 | B1 * | 3/2002 | Skofljanec | 361/752 |
| 6,392,895 | B2 * | 5/2002 | Taguchi et al. | 361/752 |
| 6,434,013 | B2 * | 8/2002 | Kitamura et al. | 361/752 |
| 6,707,678 | B2 * | 3/2004 | Kobayashi et al. | 361/752 |
| 6,849,930 | B2 * | 2/2005 | Nakajima et al. | 257/666 |
| 6,851,955 | B2 * | 2/2005 | Chen | 439/76.1 |
| 6,958,674 | B2 * | 10/2005 | Tsuchida | 338/276 |
| 7,144,275 | B2 * | 12/2006 | Iida | 439/587 |
| 7,147,485 | B2 * | 12/2006 | Ohta et al. | 439/76.1 |
| 7,151,674 | B2 * | 12/2006 | Sasaki et al. | 361/752 |
| 7,258,576 | B2 * | 8/2007 | Ohnishi | 439/620.01 |
| 7,390,199 | B2 * | 6/2008 | Honda et al. | 439/78 |
| 7,417,873 | B2 * | 8/2008 | Kadoya et al. | 361/797 |
| 7,419,385 | B2 * | 9/2008 | Itou et al. | 439/76.1 |
| 7,514,784 | B2 * | 4/2009 | Mayuzumi et al. | 257/712 |
| 7,616,448 | B2 * | 11/2009 | Degenkolb et al. | 361/752 |
| 7,640,646 | B2 * | 1/2010 | Naritomi et al. | 29/458 |
| 7,723,619 | B2 * | 5/2010 | Ohashi et al. | 174/260 |
| 7,744,381 | B2 * | 6/2010 | Honda | 439/79 |
| 7,791,888 | B2 * | 9/2010 | Tominaga et al. | 361/708 |
| 8,014,158 | B2 * | 9/2011 | Kojima | 361/752 |
| 8,023,273 | B2 * | 9/2011 | Chlumsky et al. | 361/752 |
| 8,038,914 | B2 * | 10/2011 | Suzuki et al. | 264/46.4 |
| 8,071,895 | B2 * | 12/2011 | Shiu et al. | 174/521 |
| 8,139,364 | B2 * | 3/2012 | Wickett | 361/752 |
| 2004/0062943 | A1 | 4/2004 | Naritomi et al. | 428/545 |
| 2010/0255732 | A1 * | 10/2010 | Kohmura et al. | 439/733.1 |

FOREIGN PATENT DOCUMENTS

| | | | |
|---|---|---|---|
| EP | 1890360 | | 2/2008 |
| FR | 2897750 | * | 8/2000 |
| FR | 2 897 750 | | 8/2007 |
| JP | 10-74560 | | 3/1998 |
| JP | 2003-200453 | | 7/2003 |
| JP | 2003-300249 | | 10/2003 |
| JP | 2004-87249 | | 3/2004 |
| JP | 2005-7656 | | 1/2005 |
| JP | 2005-342895 | | 12/2005 |

OTHER PUBLICATIONS

European Search Report (from corresponding European Patent App. No. 08 853 681.8; Dated Aug. 2, 2011; 6 pages.

* cited by examiner

PRIOR ART

PRIOR ART

PRIOR ART

PRIOR ART

METAL-RESIN COMPOUND MEMBER

FIELD OF THE INVENTION

The present invention relates to a metal-resin composite body in which a metal component is integrated with a resin structure of a predetermined shape or a resin structure including therein a conduction path component, such as a terminal fitting and an electric wire.

BACKGROUND OF THE INVENTION

As an example of a metal-resin composite body, FIG. 8 shows a case 1 with a connector 11 used for housing a wiring board (hereinafter referred to as a case with a connector or simply a case) in which the connector 11 that is a resin structure is integrated with a case main body 2 (also referred to as a case main body) used for housing a wiring board. The case main body 2 is a metal component and assumes a rectangular parallelepiped tray shape. The connector 11 is integrated with an opening portion 7 of a side wall 5 (simply referred to as a wall 5) formed around a bottom wall (bottom plate) 3 of the case main body 2. FIG. 8 is a general structural perspective view of the case 1. FIG. 9 is a sectional view of the case 1. In the case 1, the connector 11 is formed so as to project both inner and outer sides of the side wall 5. As shown in FIG. 9, the connector 11 includes a part of a terminal fitting 21, and each end 21a, 21b of the terminal fitting 21 projects (exposed) inward and outward of the case main body 2. In addition, the end 21b of the terminal fitting 21 is connected to a wiring board 31 to be accommodated in the case 1.

The case 1 that is the metal-resin composite body is formed by injection molding where, for example, the case main body 2 and the terminal fitting 21 are positioned (disposed) in a mold as insert articles, and resin is filled in a cavity (space) corresponding to the connector 11 (See Japanese Patent Application Laid-Open (kokai) No. H10-74560). FIGS. 8 and 9 show the case 1 with the connector 11 integrated with only one opening portion 7 (simply called as an opening) on the left hand side in the drawing. The opening 7 assumes a "U"-shaped notch that cuts into an upper end (an end opposed to a substrate) of the side wall 5.

In such case 1, a space "G" (gap) is formed between the "U"-shaped inner end (also referred to as a projecting portion) 21b, which projects inward of the case 1, of the terminal fitting 21 and the bottom wall 3 of the case main body 2. On the other hand, a portion of the connector 11 which projects outward of the case 1 has a recessed portion 16 where the outer end 21a of the terminal fitting 21 is exposed therein.

In the case 1 having the connector, the case main body 2 and the terminal fitting 21 serve as insert articles. When the connector 11—i.e., a part of the resin structure, is formed by injection molding, two main molds (metallic mold) and another metallic mold (slide core or the like) are generally required. The two main molds close the bottom wall 3 of the case main body 2, and the other metallic mold corresponds to the recessed portion 16 of the connector 11 and an undercut portion formed by the inner and outer ends 21a and 21b of the terminal fitting 21. That is, in such a resin formation, when the recessed portion 16 of the connector 11 is formed at the outer side wall 5 of the case 1, the other metal mold (slide core) that perpendicularly slides with respect to the closing direction of the two main molds is necessary. Further, for example, a detachable core (a nested mold) is required for forming the gap G between the projecting portion 21b of the terminal fitting 21, which projects inward of the side wall 5, and the bottom wall 3. That is, such case 1 that is the metal-resin composite body is integrated with the connector 11 through a molding process using the molds shown in FIGS. 10 and 11. The molding process will be described with reference to FIGS. 10 and 11. Notably, the bottom wall 3 of the case 1 is positioned upward in these drawings.

As shown in FIG. 10B, the terminal fitting 21 is disposed on a first mold 101 (lower mold in the drawing) shown in FIG. 10A. Then, as shown in FIG. 10C, a detachable core (core mold) 61 is disposed on a undercut portion corresponding to the gap G formed between the projecting portion 21b of the terminal fitting 21, which projects inward of the case 1, and the bottom wall 3. Thereafter, as shown in FIG. 10D, the case main body 2 that is the metal component is positioned relative to terminal fitting 21. Subsequently, as shown in FIG. 10E, a slide core (core type) 205 used for forming the connector 11 at the outside of the case 1 slides and is disposed on the first mold 101 from the left-hand side in the drawing, and then a second mold 201 (upper mold in the drawing) is taken down from the upper side so as to close the first mold 101 as shown in FIG. 10F. Thereafter, resin is poured (filled) in a cavity (space) K that corresponds to the connector 11 while the mold is closed (refer to FIG. 11G).

In this way, the resin-made connector 11 is integrated with the case main body 2 by injection molding while including the terminal fitting 21 therein. After solidification of the resin, the second mold 201 is released upwards in order to eject the case (molded body) as shown in FIG. 11H. Subsequently, as shown in FIG. 11I, the core 205 is slid toward the left-hand side and removed from the connector 11 (refer to FIG. 11G). Then, as shown in FIG. 11J, the molded case 1 and the core 61 are ejected from the first mold 101. Thereafter, the core 61 is slid out from the molded body 1 as shown in FIG. 11K to thereby complete the case 1 that is the metal-resin composite body.

In a metal-resin composite body, such as the case 1, portions of the connector 11 which correspond to the outside of the case main body 2 and the terminal fittings 21 that are included in the connector 11 serve as undercut portions when the connector 11 that is a resin structure is formed in the case main body 2 by injection molding. Thus, in addition to the first and second molds 101, 201 which close the bottom wall 3 therebetween as shown in FIGS. 10 and 11, the core 205 for forming the recessed portion 16 of the connector 11 and the core 61 corresponding to the gap G between the projecting portion 21b of the terminal fitting 21, which projects inward of the case, and the bottom wall 3 are necessary. Therefore, the configuration of each mold and the process of injection molding become complicated. Although the case main body 2 and the terminal fitting 21 are used as insert articles in the case 1, the same problems still remain when the case main body 2 is used as an only insert article.

That is, when manufacturing the metal-resin composite body having the above configuration, the configuration of the mold and the process of the injection molding become complicated in the case where the connector 11 that is the resin structure is integrated with the case main body 2 that is the metal component by injection molding. As the shape and the configuration of the connector 11 that is the resin structure and those of the case main body 2 that is the metal component are complicated, the structure of the mold and the process of injection molding become complicated. Thus, conventionally, there were roughly four problems on the manufacturing of such metal-resin composite body as indicated below (1)~(4):

(1) Manufacturing the mold is costly due to a complication of the mold structure, such as a slide core.

(2) The complicated mold leads to a complication of molding process and work, resulting in deterioration in a manufacturing efficiency. Therefore, the cost of the injection molding of the resin structure or the manufacturing cost of the metal-resin composite body rise.

(3) When the structure of the mold becomes complicated, a gap between the molds and/or between the mold and a closing face of a metal component (insert article) is likely to be formed. Thus, a defect, such as a burr (excessive resin), is likely to occur.

(4) Limitations on a shape of resin structure and on its structural design are required due to the reasons stated above (1)~(4). Therefore, suitable shape and structure of the resin structure may not be materialized. That is, the degree of design freedom of the resin structure is low.

The present invention has been accomplished in order to solve the above problems. An object of the present invention is to provide a technology enhancing a degree of design freedom of a resin structure of a metal-resin composite body, such as a case with a connector used for housing a wiring board in which a resin connector is integrated with a metal case main body, the metal-resin composite body comprised of: the resin structure that includes a conduction path component; and a metal component integrated with the resin structure.

SUMMARY OF THE INVENTION

According to a first aspect of the present invention, there is provided a metal-resin composite body comprising: a resin structure having a predetermined shape; and a metal component integrated with the resin structure, wherein a base resin is integrated with at least a part of a surface of the metal component where the resin structure is to be integrated by injection molding, and wherein a separately manufactured resin structure component is joined to the base resin to thereby form the resin structure.

According to a second aspect of the present invention, there is provided the metal-resin composite body according to the first aspect, wherein the resin structure includes a conduction path component therein.

According to a third aspect of the present invention, there is provided a metal-resin composite body comprising: a resin structure including therein a conduction path component, the resin structure being integrated with at least a part of a wall of the metal component so as to sandwich (capture) an edge of the wall, wherein a base resin that sandwiches the edge of the wall is integrated with at least a part of the wall by injection molding, and wherein a separately manufactured resin structure component is joined to the base resin to thereby form the resin structure.

According to a fourth aspect of the present invention, there is provided a metal-resin composite body according to any one of aspects 1 to 3, wherein the resin structure component is joined to the base resin by welding.

According to a fifth aspect of the present invention, there is provided a metal-resin composite body according to the fourth aspect, wherein the welding is conducted by laser.

According to a sixth aspect of the present invention, there is provided a metal-resin composite body according to any one of aspects 1 to 5, wherein the metal component has a roughened surface where the base resin is integrated by injection molding.

According to a seventh aspect of the present invention, there is provided a metal-resin composite body of any one of aspects 1 to 5, wherein a surface of the metal component where the base resin is integrated by injection molding has a plurality of bumps or a porous layer to which a nitrogen containing compound is absorbed.

As described above, in the metal-resin composite body according to aspects 1 to 3 of the present invention, the base resin is integrated with a predetermined part of the surface of the metal component, and the separately manufactured resin structure component with a predetermined shape is joined to the base resin. That is, unlike the conventional art in which a resin structure component is integrated with a metal component by a single injection molding process, the base resin serving as a base for the resin structure component is integrated with the metal component in advance by injection molding in the present invention. Such base resin has less complicated shape and configuration compared to that of the conventional resin structure component formed in an insert formation. Thus, a mold for injection molding and a process of the injection molding can be simplified. On the other hand, unlike the conventional manner, since the resin structure component constituting the resin structure is manufactured separately from the metal component, the resin structure component can have complicated shapes and configurations. That is, in the present invention, since the separately manufactured resin structure component is joined to the base resin that is integrated with the metal component by the injection molding, it enhances the degree of design freedom of the resin structure, such as to the shape and configuration thereof, without a rise in manufacturing cost compared to the case where a metal-resin composite body having the entirely same shape and configuration of a resin structure is manufactured.

Notably, in the resin structure according to the aspects 2 to 7, the phrase "include the conduction path component" as used herein means the following two cases: where the conduction path component used as an insert article is inserted into the resin structure that constitutes the metal-resin composite body; and where the conduction path component is press fitted or inserted into the resin structure in a post-process. Further, the phrase "the conduction path component" as used herein means a member constituting a conductive path, such as terminal fitting and an electric wire.

Although a means for joining the resin structure component to the base resin can be an adhesive agent, it is preferable to use a welding the fourth aspect. The welding includes high frequency welding, ultrasonic welding or the like. However, according to the fifth aspect, it is preferable to use laser welding in view of obtaining a better welding strength. Further, the base resin to which the resin structure component is joined is preferably firmly joined to the metal component without separating therefrom. Thus, according to the sixth aspect, the surface of the metal component is preferably roughened beforehand and the resin base is formed thereon by injection molding. In addition, a means for roughening the surface of the metal component may be a physical or mechanical means (processing means). However, according to the seventh aspect of the invention, it is preferable that the plurality of bumps or the porous layer to which a nitrogen containing compound is absorbed be formed on the surface of the metal component so that the resin serving as the base resin can hold a gripping effect.

According to the seventh aspect, the bumps or the porous layer can be formed by etching or anodic oxidation, or a combination of etching and anodic oxidation. JP2003-200453A discloses a means for allowing the nitrogen containing compound, such as an amine compound, to be absorbed to the surface of the metal component. It shows that the metal component is immersed in an aqueous solution of an amine compound in order to form bumps or a porous layer on a surface thereof, and at the same time the nitrogen containing compound is absorbed to the surface. In the immersion, the surface of the metal component is etched, and concurrently chemical absorption of the nitrogen containing compound to the bumps or the porous layer of the surface occurs. However, in the case where this means is not available, i.e., the metal component is made of magnesium alloy or zinc alloy other than aluminum or aluminum alloy, a means disclosed in JP2005-342895A can be employed. It discloses that the metal component is subjected to anodizing in order to form bumps or a porous layer on a surface thereof, and thereafter, the metal component is immersed in an aqueous solution of a amine compound (e.g., aqueous solution of ammonia, hydrazine, and/or a water-soluble amine compound) so that the nitrogen containing compound is absorbed to the surface. This means is also applicable to a metal component made of aluminum alloy. Notably, in the present invention, the size of the bumps or the pore in the porous layer varies according to a type of metal that constitutes the metal component and processing conditions.

Further, according to the seventh aspect of the present invention, the plurality of bumps or the porous layer to which the nitrogen containing compound is absorbed is formed on the surface of the metal component where the base resin is integrated. Since the base resin is injection joined to the bumps or the porous layer of the surface, the base resin is firmly joined to the metal component. Furthermore, in the metal-resin composite body according to the present invention, the resin constituting the base resin is not only joined to the metal component or a single surface (one side) of the wall of the metal component, but also joined to the inner and outer surfaces of the wall so as to sandwich these two surfaces. Thus, very high joint strength therebetween and high reliability are attainable.

DETAILED DESCRIPTION OF PREFERRED EMBODIMENTS

Figure 3:
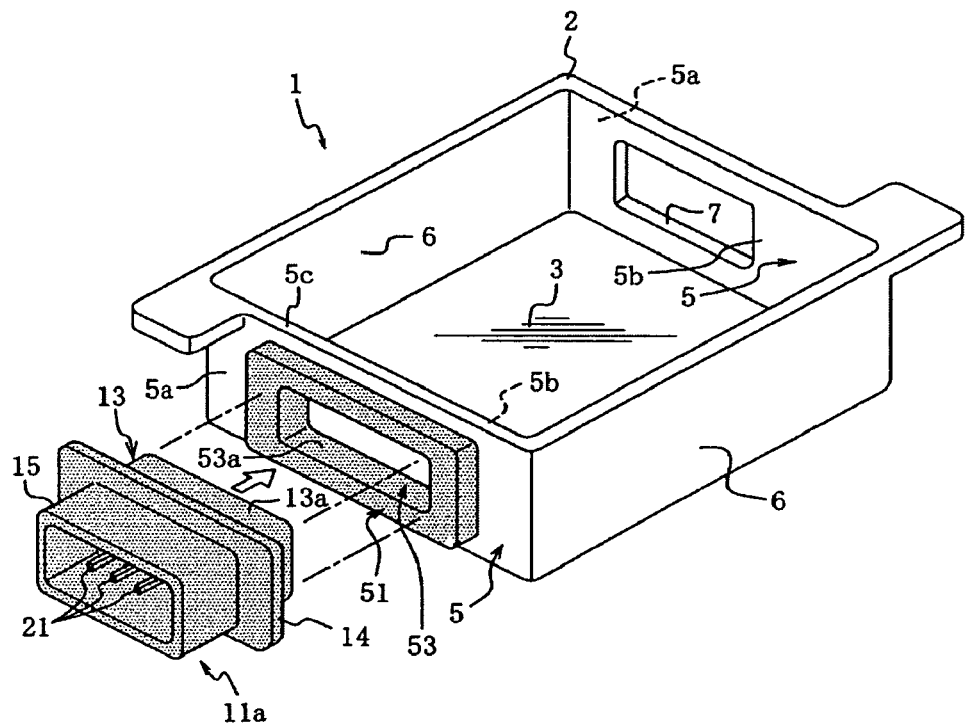
FIG. 3 is an explanatory perspective view, describing an assembling process of the case in FIGS. 1 and 2.
Figure 8:
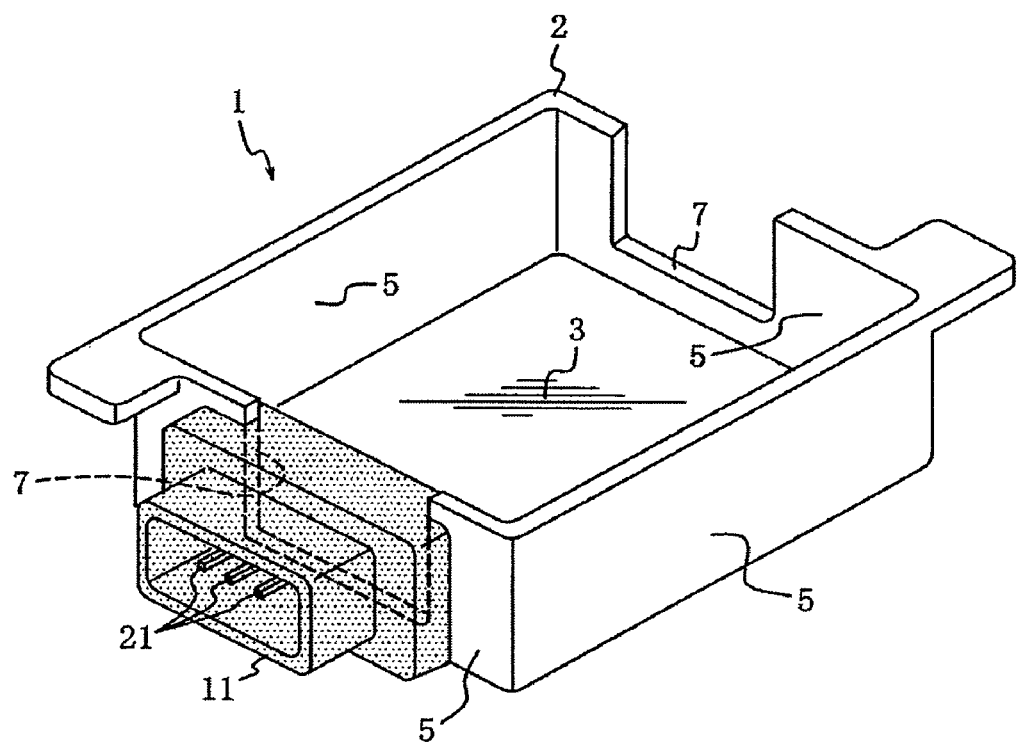
FIG. 8 is an explanatory perspective view of the case used for housing a wiring board with a connector, describing the conventional metal-resin composite body.
Figure 9:
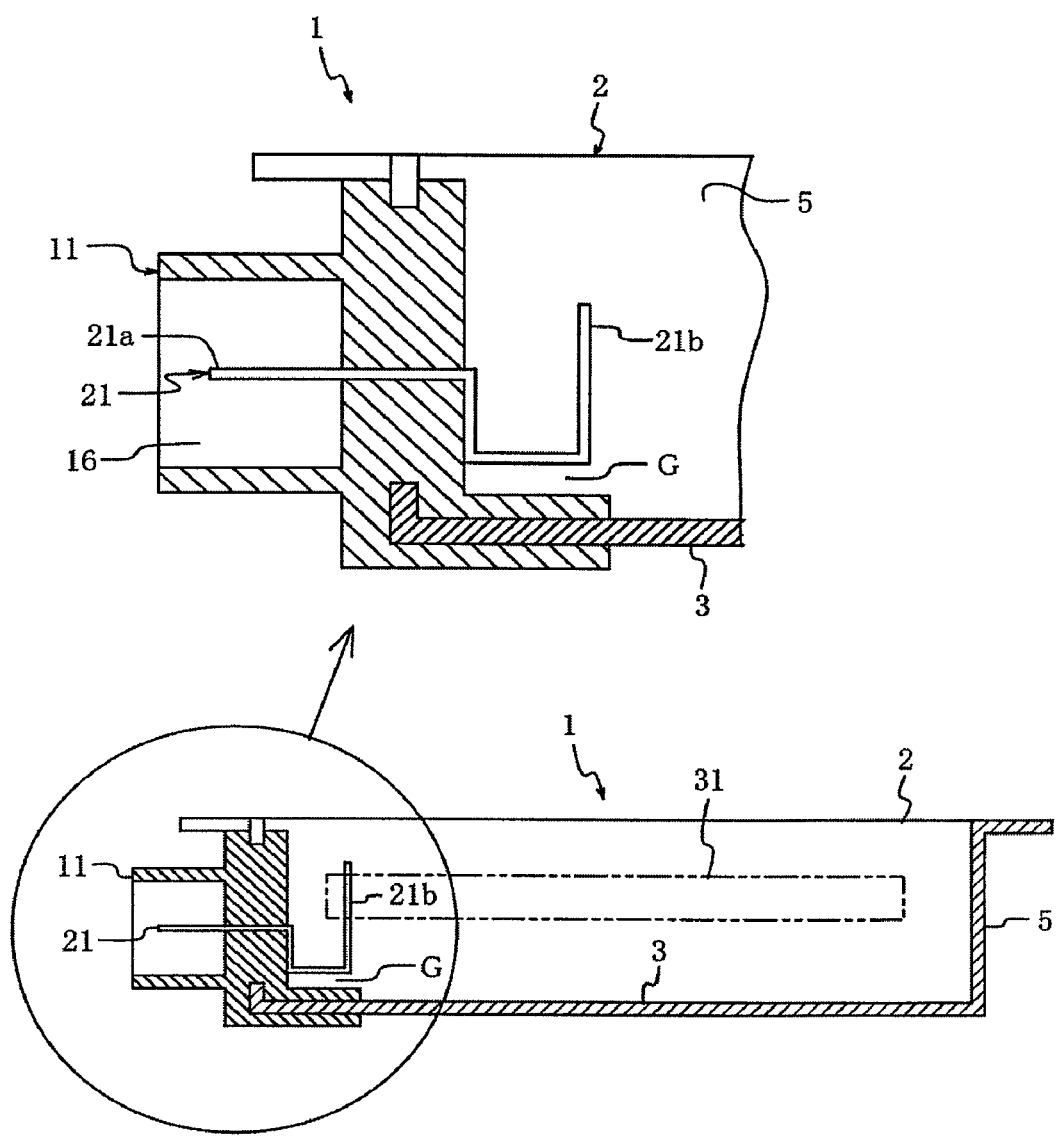
FIG. 9 is an explanatory sectional view and an enlarged view of the case used for housing a wiring board with a connector according to FIG. 8.
Figure 10:
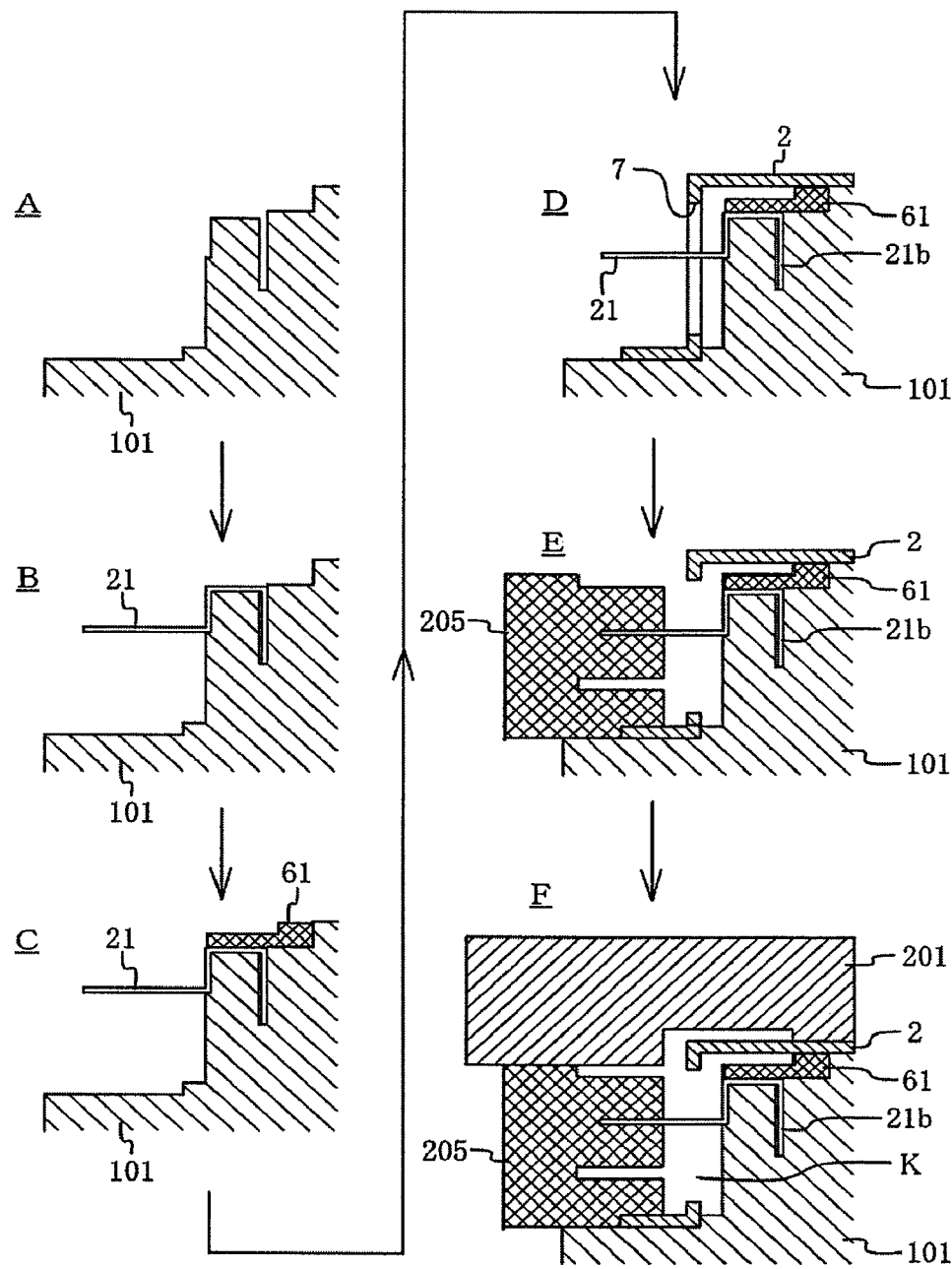
FIG. 10 is an explanatory view of a mold and a molding step for producing the case according to FIGS. 8 and 9.
Figure 11:
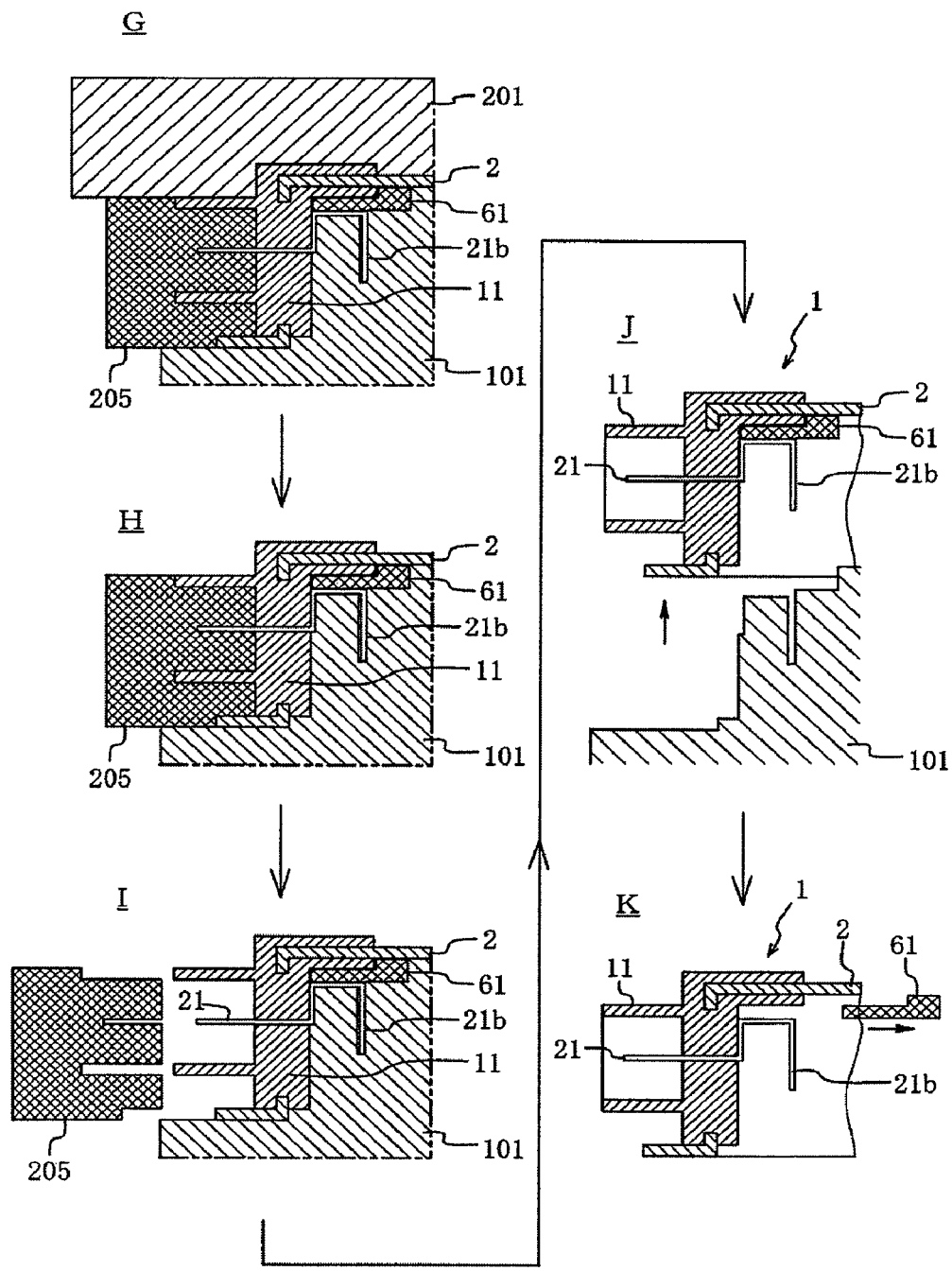
FIG. 11 is an explanatory view of a mold and a molding step for producing the case according to FIGS. 8 and 9.

An embodiment of the invention will now be described in detail with reference to the drawings 1 to 4. In this embodiment, a metal-resin composite body serves as a case 1 with a connector used for housing a wiring board, a metal component serves as a case main body, and a resin structure serves as a connector as described in the background of the invention. This metal-resin composite body (hereinafter simply referred to as a composite body) has basically the same configuration as the conventional art in FIG. 8. That is, the reference numeral "1" is the case with connector used for housing a wiring board which is the metal-resin composite body. The reference numeral "2" is the metal case main body that is a metal component and made of an aluminum, a zinc, a magnesium, or an alloy thereof. The metal case main body 2 assumes a rectangular parallelepiped shape (a tray-shape) formed by a press molding or a die-casting. Side walls 5, 6 rising from a bottom wall 3 of the case main body 2 are provided in this embodiment. An opening 7 for forming a connector 11 that is a resin structure is provided in the side walls 5, 5 that face each other (refer to FIGS. 3 and 4). Unlike an opening of the conventional art, the opening 7 is a hole assuming a window shape.

Figure 1:
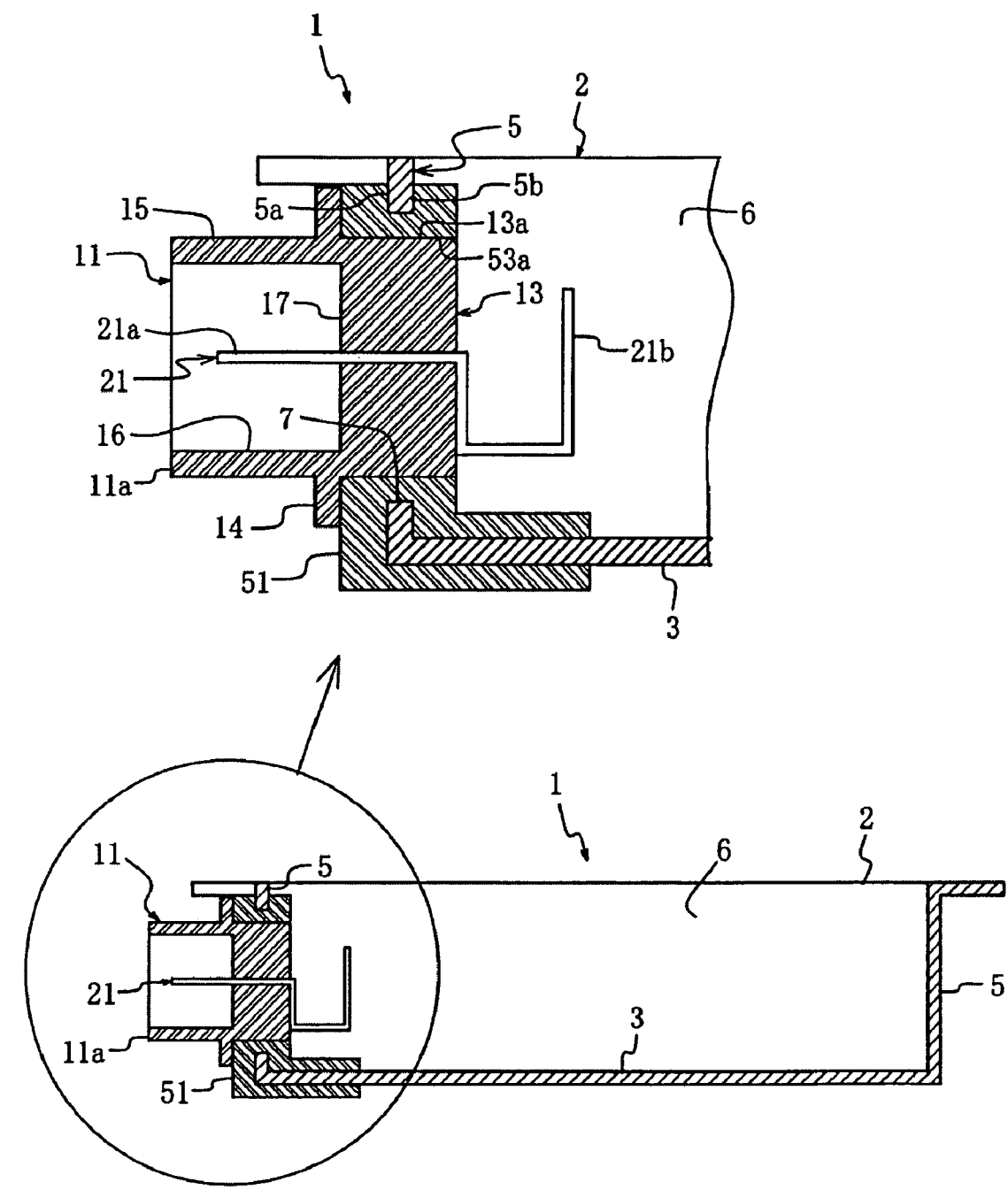
FIG. 1 is a sectional view and an enlarged view of a case used for housing a wiring board with a connector, describing an example of a metal-resin composite body according to the present invention.
Figure 2:
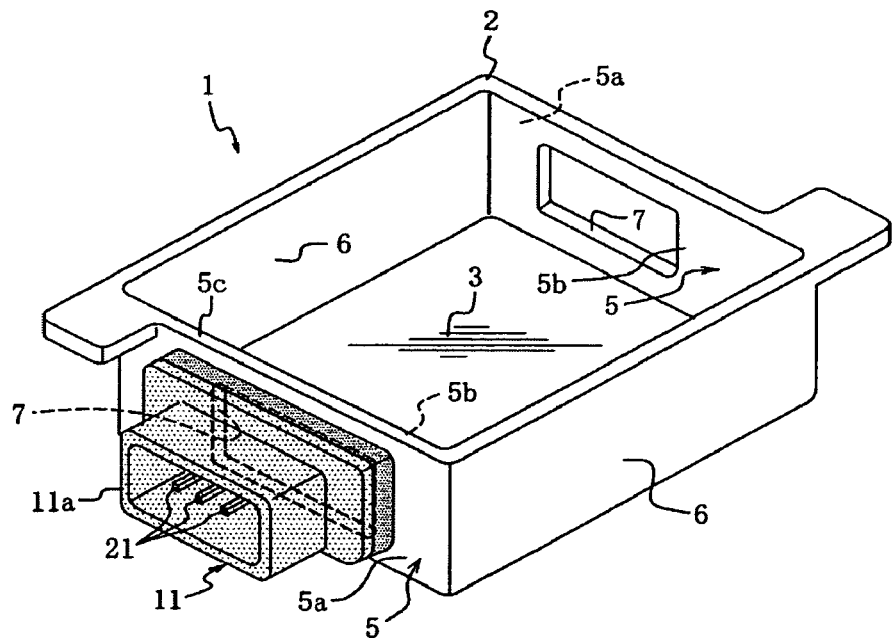
FIG. 2 is an explanatory perspective view of the case used for housing a wiring board with a connector according to FIG. 1.
Figure 4:
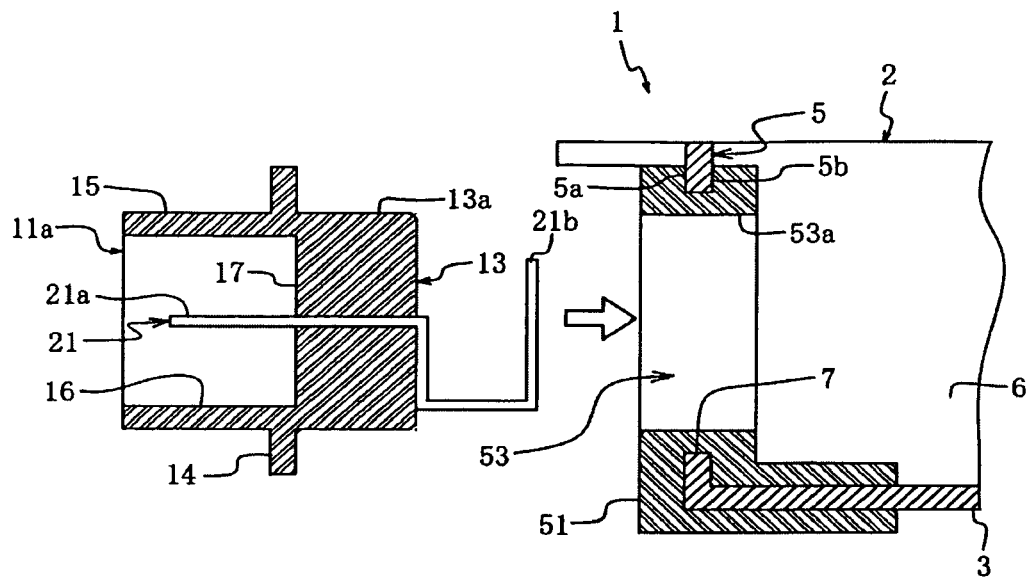
FIG. 4 is an enlarged sectional view of a main portion in FIG. 3.

A layered base resin 51 made of thermoplastic resin as a principal component is integrated with a part of a peripheral edge of the opening 7 of the case main body 2 by injection molding. The base resin 51 is integrated with the peripheral edge of the opening 7 so as to adhere to and sandwich both inner and outer surfaces 5a and 5b of the side walls 5, 5, which constitute the case main body 2. Therefore, the opening 7 is made smaller by the thickness of the base resin 51. Further, since the base resin 51 is formed on the inner and outer surfaces of the side wall 5, the side wall 5 becomes thicker. In this embodiment, the base resin 51 is formed on not only the side wall but also on a part of the bottom wall 3 so as to sandwich the bottom wall 3, as best seen in FIGS. 1 and 4. Although the opening 7 for forming the connector 11 is formed in the side walls 5, 5, respectively, only one of the openings 7 is illustrated in the drawing for the sake of convenience.

In this embodiment, a separately manufactured connector 11a, which serves as a resin structure component, is fixed to an opening 53 of the base resin 51 which is made smaller than the opening 7 by the thickness of the base resin 51 so that a fitting convex portion 13 that is an end of the connector 11a is fitted to the opening 53. The fitting convex portion 13 is formed so that an outer circumferential face 13a thereof can be fitted to an inner circumferential face 53a of the opening 53 without any gap therebetween. Further, a flange 14 projecting outward in the outer circumferential direction is provided in the outer circumferential face 13a of the fitting convex portion 13 (refer to FIGS. 3 and 4). Thus, the fitting convex portion 13 is fitted and pressed into the opening 53 from the outside of the case main body 2 so that the flange 14 is pushed against the outer surface of the base resin 51 formed on the side wall 5 of the case main body 2. In this state, a joint face of the base resin 51 and the flange 14 is welded by, for example, laser. In this embodiment, a front end face of the fitting convex portion 13 is generally level with an inner surface of the base resin 51 integrated with the case main body 2 after the joint.

The connector 11a includes a rectangular hood 15 on the opposite side of the fitting convex portion 13 where the flange 14 intervenes therebetween. A plurality of terminal fittings (conduction path component) 21 penetrating the fitting convex portion 13 and located horizontally in line is provided in a back face 17 of a recessed portion 16 that constitutes an inner surface of the hood 15. The connector 11a before being fitted to the base resin 51 may include therein the terminal fittings 21 formed by, for example, injection molding as an insert article. Alternatively, holes for assembling the terminal fittings 21 are provided in the connector 11a at the time of forming the connector 11a, and then the terminal fittings 21 may be press fitted into the holes. In the connector 11a shown in the drawing, an outer end 21a of the terminal fitting 21 which faces outward of the case main body 2 is located in the middle part of the recessed portion 16, and an inner end 21b of the terminal fitting 21 which faces inward of the case main body 2 is bent so as to assume an "U" shape.

On the other hand, when the base resin 51 is formed by injection molding in the opening 7 of the case main body 2, which is the metal component, a conventionally known metallic mold device is employed to form the case main body 2 as an insert article. In this case, the case main body 2 is disposed in a metallic mold for injection molding, and the mold is closed so that resin material is injected in a cavity to form the base resin 51 under a predetermined pressure and a temperature.

According to this embodiment, the case 1 with a connector used for housing a wiring board, which is the metal-resin composite body, the connector 11a that is the resin structure component is manufactured as described above, while the base resin 51 is separately formed in the case main body 2, which is the metal component, as mentioned above. Then, the separately manufactured connector 11a is welded to the opening 53 of the base resin 51 formed in the opening 7 of the case main body 2. At this time, the fitting convex portion 13 of the connector 11a is fitted to the opening 53 so that the flange 14 is pressed against the surface of the base resin 51 formed on the outer surface of the side wall 5 of the case main body 2.

Thus, the case 1 with a connector, which is the metal-resin composite body, used for housing a wiring board according to this embodiment provides the following effects in its manufacturing process. The connector 11a that is a resin structure component is formed individually or is formed with the terminal fitting 21 as an insert article. The connector 11a is separately manufactured from the case 2 that is a metal component. Such connector 11a can be easily manufactured, even if it has a complicated shape. On the other hand, although the case main body 2 that is a metal component is served an insert article to thereby form the base resin 51 by injection molding, such base resin 51 can be simply a base for joining the connector 11a. Therefore, the base resin 51 can have less complicated shape and configuration compared to the case where a complicated connector is directly formed. As a result, even thought the case main body 2 is served as an insert article, a mold or a process for the injection molding can be simplified without any complication.

Thereafter, the case main body 2 integrated with the injection-molded base resin 51 is joined to the separately manufactured connector 11a that is the resin structure component to complete the case 1. Even though the resin structure or the like has a complicated shape and configuration, the manufacturing of each component is relatively easy. Therefore, according to the present invention, it is possible to enhance a degree of design freedom of the metal-resin composite body without an increase in manufacturing cost compared to the case where a conventional metal-resin composite body having the same shape and configuration as that of the present invention is manufactured.

In the above-mentioned embodiment, the base resin 51 sandwiches the walls 5 and 3 which constitute the case main body 2 along the periphery edge of the opening 7 and is firmly integrated with the case main body 2. Thus, the joint strength between the wall 5 and the base resin 51 is high. Further, although the base resin 51 and the connector 11a may be joined with an adhesive material, it is preferable that laser welding as mentioned above be employed in light of quick and easy welding and its sealing property.

Figure 5:
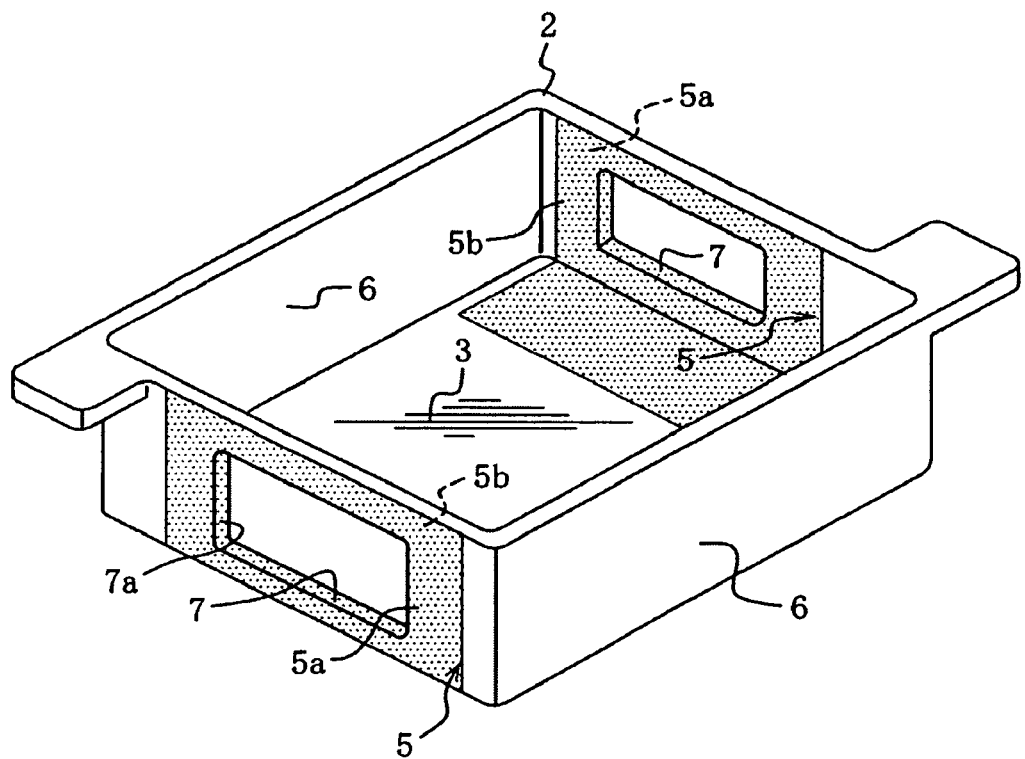
FIG. 5 is an explanatory perspective view showing a roughened area on a surface of a case main body which serves as a metal component.

In the above embodiment, when the base resin 51 is formed on the case main body 2, a surface of the case main body 2 to which the base resin 51 is joined, i.e., a shaded area in FIG. 5, is preferably roughened with a predetermined roughness before forming the base resin 51. When the surface is formed to be a roughened surface—i.e., the surface is not smooth, resin penetrates into the minute recesses of the roughened surface, and then the resin is cooled and solidified when viewed microscopically. Since the resin penetrates or is fixed into the roughened surface, a gripping effect is obtained compared to the case where the resin is employed on smooth inner and outer surfaces of the case main body 2. Thus, the joint strength of the base resin 51 and the both inner and outer wall surfaces of the case 1 can be improved. At this time, it is preferable that an inner circumferential face 7a of the opening 7—i.e., a thickness side of the side wall 5, be also roughened. Such surface roughening can be conducted by sandpaper with a predetermined grain size that corresponds to a desired roughness or by a sandblasting. The roughening process can be conducted to only a (contact) face to which the base resin 51 is joined or to a wider area than the contact face.

In addition, instead of physically roughening the surface of the case main body 2 that is the metal component, a part of the surface of the case main body 2 to which the base resin 51 is joined by the injection molding can have a plurality of minute bumps or a porous layer where a nitrogen containing compound is adsorbed. Thus, when the base resin 51 is formed on the plurality of minute bumps or the porous layer, the base resin 51 firmly joins to the case main body 2. As mentioned above, the plurality of minute bumps or the fine porous layer, to which the nitrogen containing compound (more particularly, an amine compound) is adsorbed (chemical adsorption), is formed on a surface of the case main body 2 to which the base resin 51 is integrated. Then, in the injection molding of the base resin 51, the resin is injected against the case main body 2 under high temperature and high pressure so as to join the face where the plurality of minute bumps or the fine porous layer is formed. Thus, the joint strength is improved. Particularly, when the resin constituting the base resin 51 sandwiches the walls 5 and 3, much higher joint strength is achievable, compared to a case where the injection molding is conducted to only one side of the wall.

A publicly known patent document (JP2003-200453 A) discloses a typical method for forming the plurality of minute bumps or the fine porous layer to which an amine compound is absorbed on the surfaces of the wall 5, 3 of the case main body 2. When the case main body 2 is made of aluminum alloy, the surfaces are immersed in any one or more sorts of aqueous solutions selected from ammonia, hydrazine, and/or a water-soluble amine compound to thereby form a plurality of minute bumps or a fine porous layer on the entire surfaces, as well as a amine compound can be absorbed thereto. The patent document states that the surfaces are etched by the immersion, resulting in the amine compound being chemically absorbed to the minute bumps or the fine porous layer formed on the surfaces.

As disclosed in a publicly known patent document (JP2005-342895A), when the case main body 2 that is the metal component is made of magnesium alloy or zinc alloy, the plurality of minute bumps or the fine porous layer is formed on the surfaces by anodization, and thereafter, the surfaces are immersed in any one sort of aqueous solutions selected from ammonia, hydrazine, and/or a water-soluble amine compound so that the amine compound is absorbed to the surfaces. This method is also applicable to the aluminum alloy. In this case, the plurality of minute bumps or the fine porous layer may be formed not only on the wall of the case main body 2, which is the metal component, but on the entire surfaces of the case main body 2. Portions of the case main body 2 where the plurality of minute bumps or the porous layer is not required may be masked. Thermoplastic resin constituting the base resin 51 can be selected from polybutylene terephthalate resin, polyphenylene sulfide resin, nylon resin or a composition containing such resin as a principal component. Further, a typical composition containing other than such resin is cited from glass fiber, carbon fiber or aramid fiber.

The present invention is not particularly limited to the embodiments described above but may be modified within the scope of the invention. For example, the case with a connector used for housing a wiring board is served as a metal-resin composite body, the case main body is served as a metal component and the connector is served as a resin structure in the above embodiment. However, the metal-resin composite body, the metal component constituting the metal-resin composite body, the resin structure and a resin structure component constituting the resin structure are not limited to those in the above embodiment. Next, another embodiment will be described. However, a metal-resin composite body is a case 201 used for housing a wiring board, the same as that of the above embodiment.

Figure 6:
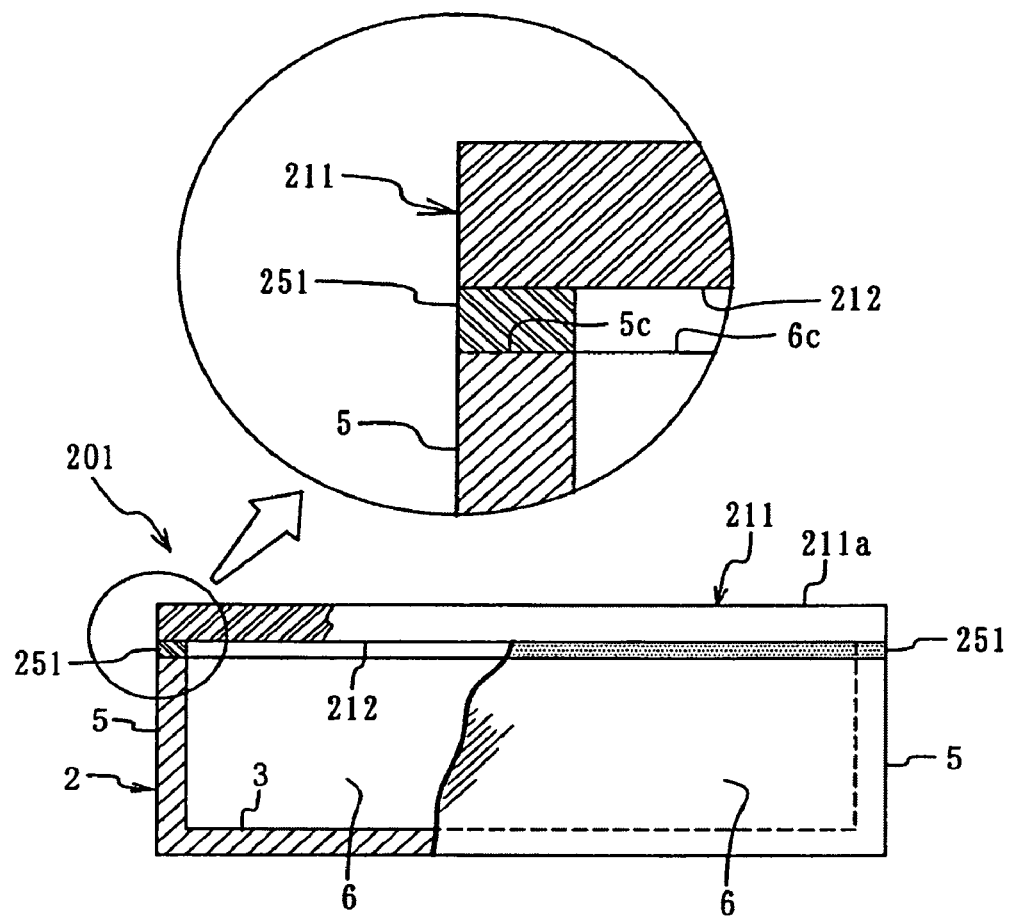
FIG. 6 is a fractured sectional view of the case used for housing a wiring board, and an enlarged view of a main portion of the case, which serves as a metal-resin composite body of another example.

FIG. 6 is a partially broken, sectional view of the case 201 used for housing a wiring board. In this embodiment, there is only one difference from the above embodiment that a lid (cover) 211 for sealing an upper opening of the case main body 2, which is the metal component, is added as the resin structure. That is, as shown in FIG. 6, a base resin 251 is formed on upper ends (upper end face) 5c and 6c of the side walls 5, 6 of the case main body 2, and a lid member 211a that is the resin structure component and constituting the lid (cover) 211 is joined to the upper end of the base resin 251. Therefore, only the differences will be described, and the same numerals are used for the same part. The connector that is the resin structure in the above embodiment and the terminal fittings are omitted in FIG. 6.

Figure 7:
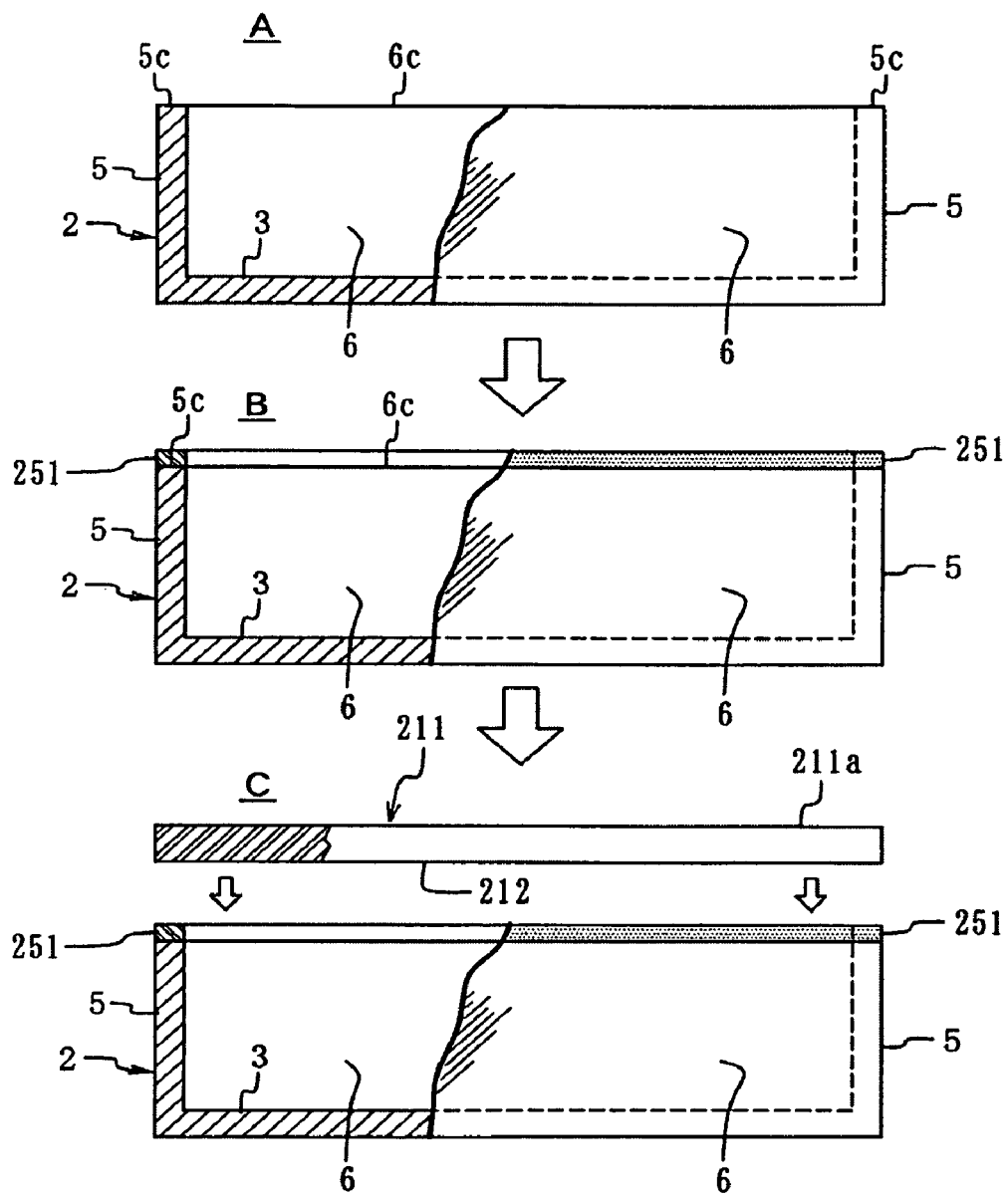
FIG. 7 is an explanatory view of an assembling process of the case in FIG. 6.

In this embodiment, the layered base resin 251 having a predetermined thickness is integrated with the upper ends (upper end face) 5c, 6c of the side walls 5, 6 by injection molding in a manner that goes around the upper opening of the case 201 in the plane view (FIGS. 7A and 7B). The lid member 211a, which is the resin structure component and constituting the lid 211, is separately manufactured. The lid member 211a has a predetermined thickness and assumes, for example, a plate-like shape, and its outline corresponds to the outer peripheral edge of the side walls 5, 6 of the case main body 2 in the plan view. The lid member 211a is overlaid from the upper side so that a peripheral edge of a bottom face 212 of the lid member 211a is laid on the base resin 251 (the upper surface) (refer to FIG. 7C). Subsequently, the lid member 211a and the base resin 251 are welded by, for example, laser or the like. In this way, the case 201 used for housing a wiring board and including the lid 211 having the predetermined shape is completed as shown in FIG. 6. Such case 201 is suitably used for housing a component (not illustrated), such as a wiring board, in the case main body 2, and thereafter, the lid member 211a is joined thereto to provide a seal.

As examples of the resin structure component manufactured separately, it is not limited to the connector in FIGS. 1 to 5 which has a relatively complicated shape or configuration. The resin structure component may assume a simple plate shape, such as the lid 211 in this embodiment. The lid member 211a, which is the resin structure component in this embodiment, can provide a secure seal of the case main body 2. Thus, the cost for sealing the case can be reduced compared to a conventional method for sealing the case where a metal or resin lid is fixed by a screw through a rubber packing or the like. In this conventional sealing method, the case main body 2 is filled by resin after accommodating therein a component, such as a wiring board, and thereafter, the lid is overlaid in order to improve the sealing property. Thus, the sealing process and the configuration of the case were complicated. On the other hand, the configuration of the case 201 in FIG. 6 can be simplified. The resin structure component according to the present invention can be embodied, irrespective of the shape and configuration of the case. Further, the metal-resin composite body is not limited to the case used for housing a wiring board, but may be widely applicable to other purposes.

In the above embodiment, the terminal fitting is embodied as a conduction path component included in the resin structure and inserted in the resin structure component. However, as mentioned above, such terminal fitting may be press-fitted into a hole of the resin structure after manufacturing the resin structure. That is, the resin structure including the conduction path component in the present invention means the resin structure where a conduction path component is actually included therein or is later assembled therewith.

The invention claimed is:
1. A metal-resin composite body comprising:
a resin structure having a predetermined shape and including a base resin and a resin structure component; and
a metal component integrated with the resin structure,
wherein said base resin is integrated with at least a part of a surface of the metal component, where the resin structure is to be integrated, by injection molding, and
wherein the separately manufactured resin structure component is joined to the base resin to thereby form the resin structure, characterized in that
the base resin has an opening extending therethrough, said opening defining an inner circumferential face, and
the separately-manufactured resin structure component has a fitting convex portion and a flange portion,
said fitting convex portion having an outer circumferential face and being disposed at an end of the separately-manufactured resin structure component,
said flange portion projecting outwardly in an outer circumferential direction from said outer circumferential face of the fitting convex portion,
said fitting convex portion of said resin structure being dimensioned to be received within the opening of said base resin without any gap between said outer circumferential face of said fitting convex portion and said inner circumferential face of said opening, and said flange portion of said separately-manufactured resin structure being joined to the base portion.

2. The metal-resin composite body according to claim 1, wherein the resin structure includes a conduction path component therein.

3. A metal-resin composite body according to claim 1, wherein the base resin is formed such that it sandwiches an edge of a wall of the metal component and is integrated with at least a part of the wall by injection molding.

4. The metal-resin composite body according to any one of claims 1 to 3, wherein the resin structure component is joined to the base resin by welding.

5. The metal-resin composite body according to claim 4, wherein the welding is conducted by laser.

6. The metal-resin composite body according to any one of claims 1 to 3, wherein the metal component has a roughened surface where the base resin is integrated by injection molding.

7. The metal-resin composite body of any one of claims 1 to 3, wherein a surface of the metal component where the base resin is integrated by injection molding has a plurality of bumps or a porous layer to which a nitrogen containing compound is absorbed.

8. A metal-resin composite body according to claim 4, wherein the metal component has a roughened surface where the base resin is integrated by injection molding.

9. A metal-resin composite body according to claim 5, wherein the metal component has a roughened surface where the base resin is integrated by injection molding.

10. A metal-resin composite body according to claim 4, wherein a surface of the metal component where the base resin is integrated by injection molding has a plurality of bumps or a porous layer to which a nitrogen containing compound is absorbed.

11. A metal-resin composite body according to claim 5, wherein a surface of the metal component where the base resin is integrated by injection molding has a plurality of bumps or a porous layer to which a nitrogen containing compound is absorbed.

* * * * *